United States Patent [19]

Williams

[11] 4,220,912

[45] Sep. 2, 1980

[54] VEHICLE SPEED CONTROL CIRCUIT TESTER

[75] Inventor: James A. Williams, Richmond, Ind.

[73] Assignee: Dana Corporation, Toledo, Ohio

[21] Appl. No.: 817,186

[22] Filed: Jul. 20, 1977

[51] Int. Cl.³ .......................................... G01R 31/02
[52] U.S. Cl. .................................... 324/51; 324/73 R
[58] Field of Search .................. 324/51, 66, 73 R, 133

[56] References Cited

U.S. PATENT DOCUMENTS

| 2,717,988 | 9/1955 | Myers | 324/51 UX |
|---|---|---|---|
| 3,417,326 | 12/1968 | Harris | 324/51 |
| 3,428,888 | 2/1969 | Nolte | 324/51 |
| 3,596,269 | 7/1971 | Laska | 324/51 X |
| 3,967,257 | 6/1976 | Hager | 324/51 UX |
| 3,991,367 | 11/1976 | Chapman et al. | 324/133 |
| 4,028,621 | 6/1977 | Bloxam | 324/133 X |

Primary Examiner—Gerard R. Strecker
Attorney, Agent, or Firm—Wilson, Fraser & Clemens

[57] ABSTRACT

An apparatus for testing the current path integrity and operation of a wiring harness and associated components for a vehicle speed control. The testing instrument is powered from the vehicle power supply and utilizes LEDs to provide a visual indication as to the proper and/or improper operation of the tested circuit. Each LED is connected in series with a current limiting resistor and one or more of the LEDs are connected in series with a blocking diode to protect the LEDs from reverse polarity voltages. Diodes are also connected in parallel with one or more of the LEDs, their series resistors and the blocking diode to limit the forward bias voltages which can develop across the LEDs.

3 Claims, 3 Drawing Figures

VEHICLE SPEED CONTROL CIRCUIT TESTER

BACKGROUND OF THE INVENTION

1. Field of the Invention

This invention relates in general to an electrical testing instrument with visual indicators, and in particular to a testing instrument with visual indicators which is utilized to test the current path integrity between various points in an active electrical circuit.

2. Description of the Prior Art

Heretofore, various testing devices have been utilized to check the correctness of the wiring connections of an electrical circuit. Several of these testing devices have visual indicators which display information as to the operation of the circuit. One such device is utilized to test integrated circuit connections for correct wiring, short circuits, broken connections, etc. The device comprises a module having pins which plug into the integrated circuit sockets. The module pins are connected to the anodes of a group of light emitting diodes (LEDs) having cathodes connected to a common line through current limiting resistors. A battery and a probe are connected between the common line and a pin of the test module lighting the LEDs in a chain of circuits to indicate proper and/or improper connections. However, this device is limited in its range of applications as a testing instrument since it is not suitable for effectively testing an active electrical circuit. This device is disclosed in U.S. Pat. No. 3,931,574 issued Jan. 6, 1976 to Ralph W. Curtis, Jr. et al.

Another device includes a plurality of terminals each of which is connected through a separate visual indicator and a diode in parallel with a common line. A high level logic signal is coupled through its associated indicator and one or more of the diodes to at least one low level logic signal to provide indications of the state of the logic signal at each terminal. However, this device is also limited in its range of applications. Although this device can be utilized to test an active circuit, the visual indicators associated with this device are not protected from either excessive forward or reverse polarity voltages which the test device can incur in some types of active circuits. Such a device is disclosed in U.S. Pat. No. 3,999,126 issued Dec. 21, 1976 to Robert J. Gaber.

SUMMARY OF THE INVENTION

The present invention concerns a testing instrument which can be utilized to test the current path integrity between various points in an active electrical circuit. The instrument is a passive circuit which utilizes the power supply of the tested active circuit. The instrument includes a plurality of light emitting diodes (LEDs) which display information as to the operation of the tested circuit. A resistor is connected in series with each LED to provide current limiting protection. A blocking diode is connected in series with some of the LEDs to protect the LEDs from reverse polarity voltages. Three serially connected diodes are connected in parallel with some of the LEDs, their series resistors and the blocking diode to limit the forward bias voltages which can develop across the LEDs.

In its preferred embodiment, the testing instrument is utilized to test a wiring harness which is external to a vehicle speed control circuit. By testing the current path integrity between various points in the wiring harness assembly, the user can quickly determine whether or not the wiring harness assembly is functioning properly. The testing instrument can be used either to check the operation of the harness assembly immediately after installation or to facilitate the troubleshooting of a defective harness.

It is an object of the present invention to effectively test the current path integrity between various points in an active electrical curciut.

It is another object of the present invention to test the operation of a wiring harness assembly which is external to a vehicle speed control circuit.

DESCRIPTION OF THE PREFERRED EMBODIMENT

Figure 1:
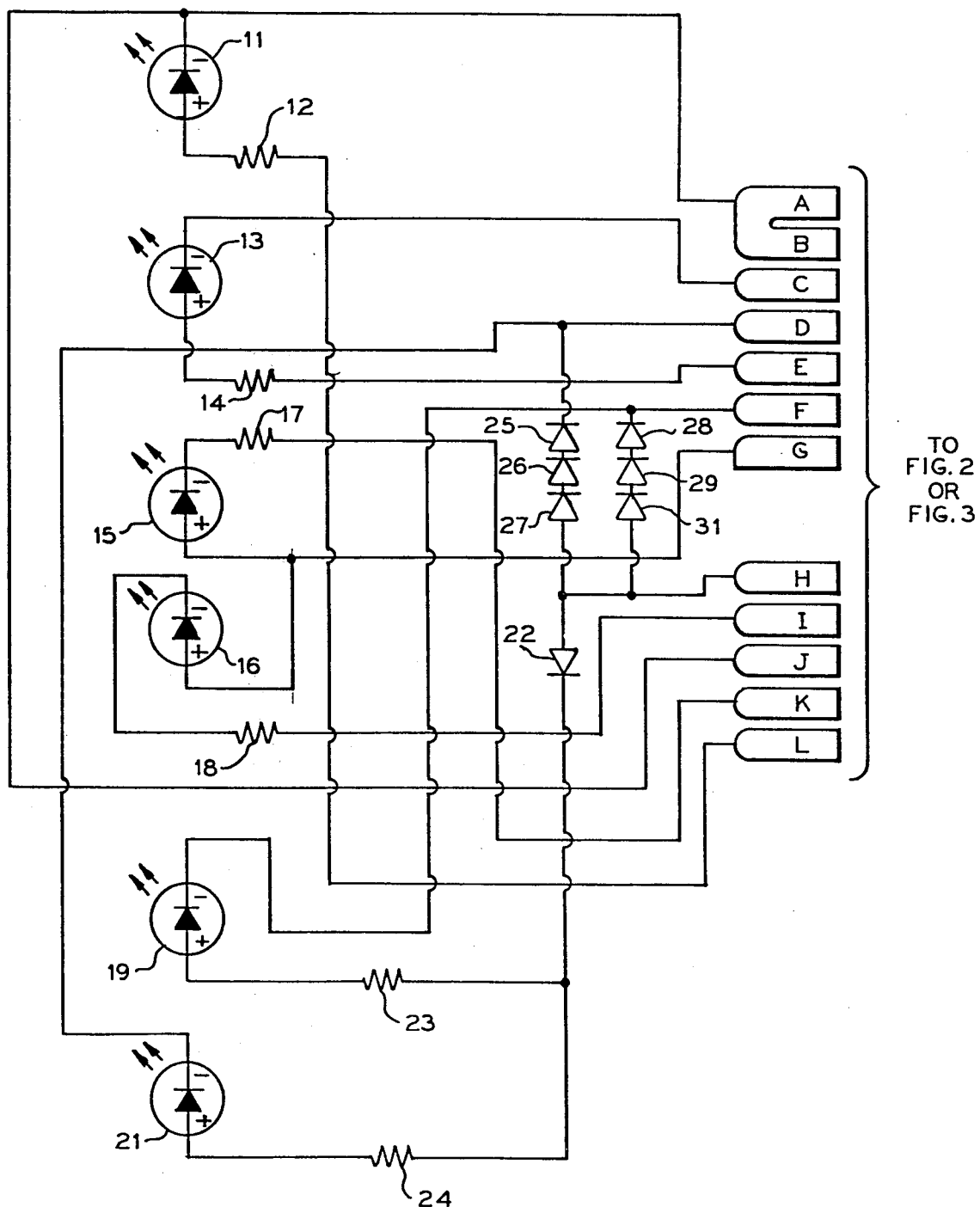
FIG. 1 is a schematic diagram of a test instrument according to the present invention.

Referring to FIG. 1, there is shown a schematic diagram of a testing instrument according to the present invention. The testing instrument can be utilized to test a wiring harness and its associated components which are external to a vehicle speed control. The testing instrument includes a plurality of plug connectors designated with the letters "A" through "L" which are adapted to connect with a plurality of socket connectors of the wiring harness which are correspondingly designated "A" through "L".

The circuit shown in FIG. 1 also includes six light emitting diodes (LEDs) which are utilized to visually indicate the current path integrity of the wiring harness and the proper or improper operation of the associated components. The circuit is passive and utilizes the vehicle power supply to provide operating power to the LEDs. An LED 11 has a cathode connected to the plug connectors A, B and J and an anode connected to the plug connector L through a resistor 12. The resistor 12 functions to limit the current which can flow through the LED 11. An LED 13 has a cathode connected to the plug connector C and an anode connected to the plug connector E through a current limiting resistor 14.

A pair of LEDs 15 and 16 each have an anode connected to the plug connector G. The LED 15 has a cathode connected to the plug connector K through a current limiting resistor 17 and the LED 16 has a cathode connected to the plug connector I through a current limiting resistor 18. A pair of LEDs 19 and 21 each have a cathode connected to the plug connectors. F and D respectively and an anode connected to the cathode of a blocking diode 22 through a pair of current limiting resistors 23 and 24 respectively. The blocking diode 22 has an anode connected to the plug connector H and functions to protect the LEDs 19 and 21 from reverse polarity signals.

Three diodes 25, 26 and 27 are connected in series between the plug connectors D and H. The polarity of the three diodes is such that the anodes are connected to the plug connector H and the cathodes are connected to the plug connector D. The diodes 25, 26 and 27 function to protect the LED 21 by limiting the voltage which can develop across the LED 21, the diode 22 and the resistor 24. Three more diodes 28, 29 and 31 are connected in series between the plug connectors F and H with the anodes connected to the plug connector H and the cathodes connected to the plug connector H. The diodes 28, 29 and 31 function to protect the LED 19 by limiting the voltage which can develop across the LED 19, the diode 22 and the resistor 23.

Figure 2:
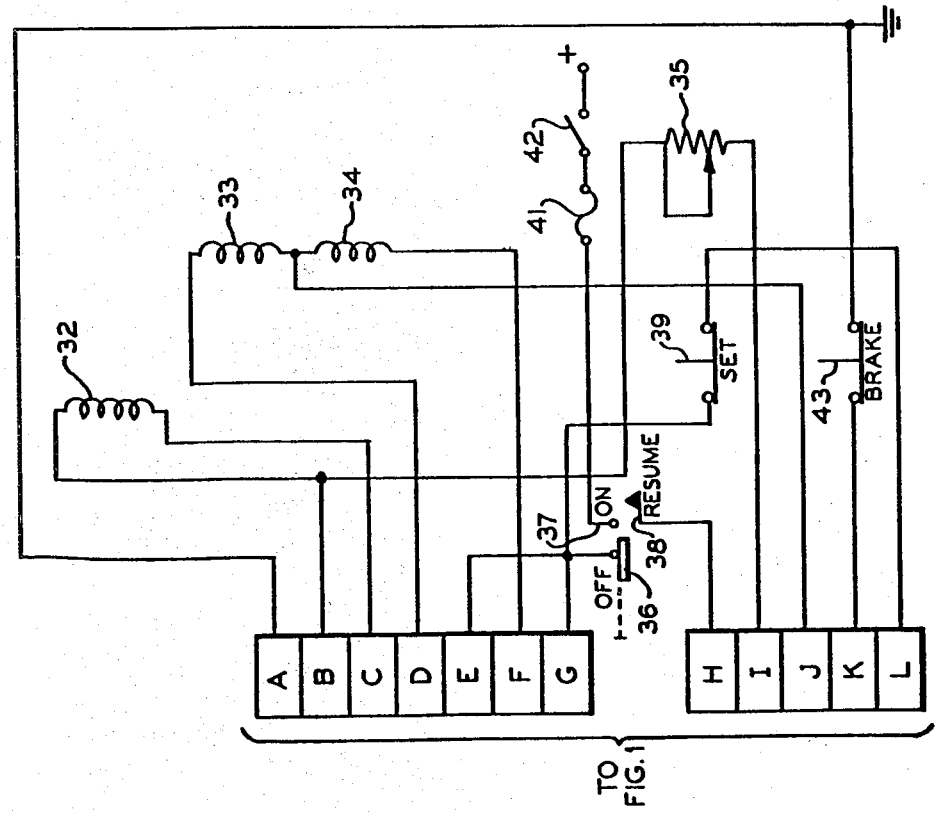
FIG. 2 is a schematic diagram of a wiring harness assembly which includes a normally closed brake switch and which can be tested with the test instrument of FIG. 1.

Before discussing the operation of the test instrument of FIG. 1, a part of the circuits which can be tested utilizing the present invention will be described. Referring to FIG. 2, there is shown a wiring harness and its associated components which are external to a vehicle speed control circuit. A plurality of socket connectors designated A through L are typically provided for connection with respective plug connectors of a vehicle speed control circuit. Among the associated components is a road speed coil 32 which typically is utilized to sense the rotation of a magnet which is rotating at a speed which is proportional to the speed at which the vehicle is traveling and is connected between the socket connectors B and C. A charge coil 33 is connected between the socket connectors D and J and a vent coil 34 is connected between the socket connectors J and F. The charge coil 33 and the vent coil 34 function to control a pair of valves which connect a bellows to a source of vacuum such as the engine manifold and atmospheric pressure respectively. The bellows is connected to the vehicle throttle linkage and operates to increase the throttle position when in communication with the vacuum source. A potentiometer 35 is connected between the socket connectors B and I and functions to generate a feedback signal to the speed control circuit. This feedback signal is utilized to anticipate the effect of change in throttle position thereby minimizing or avoiding overshoot of the vehicle throttle.

A speed control engagement switch 36 is typically a slide switch having a disengaged or off position as shown. The switch 36 can be actuated to a latched on position wherein an on terminal 49 is contacted and can be further actuated to a momentary resume position wherein a resume terminal 51 is engaged until the switch is released to return to the on position. The off terminal of the switch 36 is connected to the socket connectors E and G and to one terminal of a normally open, momentary contact, pushbutton set switch 39. The on terminal 37 is connected to the positive polarity side of the vehicle power supply through a fuse 41 and a normally open switch 42 connected in series. The switch 42 is typically the ignition switch of the vehicle such that power is supplied to the on terminal 37 when the vehicle is turned on. The resume terminal 38 is connected to the socket connector H and the other terminal of the set switch 39 is connected to the socket connector L.

The set switch 39 is actuated when the vehicle operator desires to maintain the present speed of the vehicle. Actuation of the switch 39 engages the speed control which automatically maintains the speed until disengaged by the operation of the vehicle brakes, the return of the switch 36 to the off position or the opening of the ignition switch 42. The switch 36 can be actuated to the resume position to re-engage the speed control after it has been disengaged by applying the vehicle brakes. When the switch 36 is released from the resume position, the vehicle will return to the previously maintained speed.

A normally closed brake switch 43 is connected between the socket connector K and the ground potential side of the vehicle power supply (not shown). The socket connector A is also connected to this ground potential. Typically, the switch 43 is connected such that when the vehicle brake pedal is depressed, the switch is actuated to disengage the speed control.

Referring to FIGS. 1 and 2, the operation of the test instrument will now be discussed. Assuming that the plug connectors A through L of the test instrument are connected to the socket connectors A through L of the wiring harness and that all switches are in the released or disengaged positions, the switch 36 is actuated to the on position for the first test. If all of the LEDs are off, this indicates that the wiring harness has not been connected to the positive polarity side of the vehicle power supply in such a manner that current is flowing when the vehicle ignition switch is off. This test and other tests which can be performed with the test instrument are shown in the following "Chart Of Tests."

CHART OF TESTS

| Switch Condition | Indication | Result |
|---|---|---|
| 1. Ignition Switch 42 OFF Engagement Switch 36 ON | All LEDs OFF | System correct |
| | Any LED ON | System not connected to power source through ignition switch 42 |
| 2. Ignition Switch 42 ON Engagement Switch 36 ON | LEDs 11,13,15,16 ON LEDs 19, 21 OFF | System correct |
| | Any incorrect indication | Refer to LED functions listed below |
| 3. Ignition Switch 42 ON Engagement Switch 36 ON Set Switch 39 Actuated | LEDs 13,15,16 ON LEDs 11,19,21 OFF | System correct |
| | Any incorrect indication | Refer to LED functions listed below |
| 4. Ignition Switch 42 ON Engagement Switch 36 ON Brake Switch 43 Actuated | LEDs 11,13,16 ON LEDs 15,19,21 OFF | System correct |
| | Any incorrect indication | Refer to LED functions listed below |
| 5. Ignition Switch 42 ON Engagement Switch 36 ON and in the Resume position. | All LEDs ON | System correct |
| | Any incorrect indication | Refer to LED functions listed below |

LED FUNCTIONS

| LED | FUNCTION |
|---|---|
| LED 11 | Should be ON only when set switch 39 is not actuated. If OFF when it should be ON, probable causes are: no power, blown fuse, bad ground connection at socket connector A, bad connections to engagement switch 36, inoperative engagement switch 36, inoperative set switch 39. |
| LED 13 | Should be ON only when a current path is provided through road speed coil 32. If OFF when it should |

-continued

| | |
|---|---|
| | be ON, probable causes are: bad connection at socket connector B or E, bad read speed coil. |
| LED 15 | Should be ON only when the brake switch 43 is not actuated. If OFF when it should be ON, probable causes are: bad connection at socket connector E or K, brake switch 43 not properly adjusted or operative. |
| LED 16 | Should be ON only when a current path is provided through the potentiometer 35. If OFF when it should be ON, probable causes are: bad connection at socket connector B or I, potentiometer 35 not functioning properly. |
| LED 19 | Should be ON only when engagement switch 36 is in the resume position and a current path is provided through the vent coil 34. If OFF when it should be ON, probable causes are: bad connection at socket connector F or J, engagement switch 36 not functioning properly in resume position, bad servo vent coil. |
| LED 21 | Should be ON only when engagement switch 36 is in the resume position and a current path is provided through the charge coil 35. If OFF when it should be ON, probable causes are: bad connection at socket connector D or J, engagement switch 36 not functioning properly in resume position, bad servo charge coil. |

Figure 3:
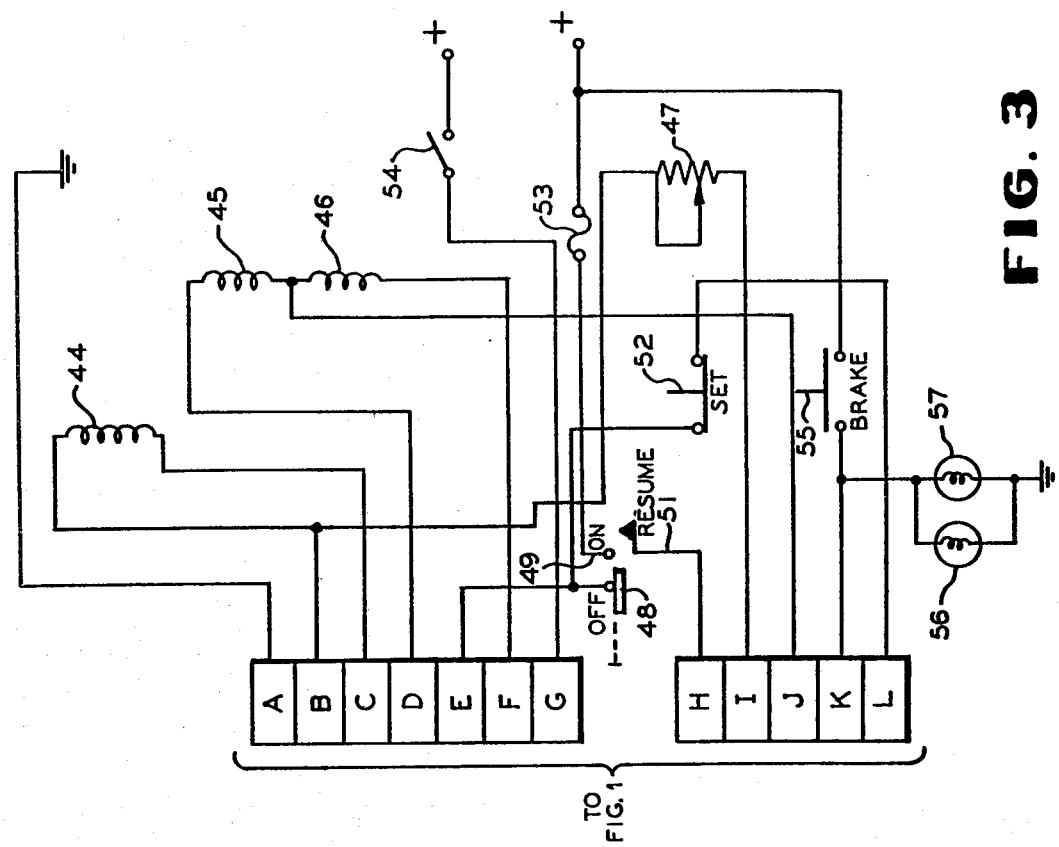
FIG. 3 is a schematic diagram of a wiring harness assembly which includes a normally open brake switch and which can be tested with the test instrument of FIG. 1.

Referring to FIG. 3, there is shown a schematic diagram of a second wiring harness and associated components which can be tested utilizing the present invention. This circuit represents the wiring harness and associated components which are external to a vehicle speed control of the type disclosed in U.S. Pat. No. 3,946,707 entitled "Electronic Vehicle Speed Control" which is assigned to the assignee of the present invention. A plurality of socket connectors A through L correspond to the plug connectors A through L of the test instrument of FIG. 1. A road speed coil 44, a charge coil 45, a vent coil 46 and a feedback potentiometer 47 are connected to the wiring harness in a manner similar to the elements 32, 33, 34 and 35 respectively of FIG. 2. An engagement switch 48 is shown in the disengaged position and has an on terminal 49 and a resume terminal 51. The off terminal is connected to the socket connector E and to one terminal of a normally closed, momentary contact, set switch 52. The on terminal 49 is connected to the positive polarity side of the vehicle power supply (not shown) through a fuse 53 and the resume terminal 51 is connected to the socket connecter 51. The other terminal of the set switch 52 is connected to the socket connector L.

A normally open ignition switch 54 is connected between the positive polarity side of the vehicle power supply (not shown) and the socket connector G. A normally open momentary contact brake switch 55 is connected between the positive polarity side of the vehicle power supply (not shown) and the socket connector K. A pair of parallel connected brake lights 56 and 57 are connected between the socket connector K and the ground potential side of the vehicle power supply. The switches 48 and 52 function in a manner similar to the switches 36 and 39 respectively of FIG. 1. When the brake switch 55 is actuated, the brake lights 56 and 57 are turned on and the speed control is disengaged.

As previously mentioned, the testing instrument can also be utilized to test the wiring harness assembly of FIG. 3. The manner of testing is similar to the manner previously described for the harness assembly of FIG. 2. Thus, the above "Chart of Tests" can be used when testing the circuit of FIG. 3 if the reference numbers of the elements of FIG. 3 are substituted for the corresponding element reference numbers of FIG. 2. However, it should be noted that the ignition switch 54 is only required to be on when it is desired to check operation of either the potentiometer 47 or the brake switch 55.

The testing instrument of FIG. 1 can be utilized either to check the operation of the harness assembly immediately after installation or to facilitate the troubleshooting of a defective harness assembly. Since the state of each LED in the testing instrument of FIG. 1 corresponds to the proper operation of a particular portion of the harness assemblies of FIGS. 2 and 3, the testing instrument can enable the user to quickly determine the defective portion(s).

In summary, the present invention concerns an apparatus for testing the current path integrity between two points in an electrical circuit including a source of electrical power. The circuit can be, for example, a wiring harness and associated electrical components external to a vehicle speed control apparatus. The testing apparatus includes a plurality of means for connecting it to selected points in the wiring harness, at least one visual light emitting means connected between a pair of the connecting means, the visual light emitting means being powered by the source of electrical power for indicating the current path integrity and operation of that portion of the wiring harness and any of the electrical components connected between the selected points corresponding to the pair of connecting means; a current limiting means connected in series with the visual light emitting means; and a voltage limiting means connected in parallel with the visual light emitting means. Typically, the visual light emitting means is a light emitting diode, the current limiting means is a resistor and the voltage limiting means includes at least one diode. The test apparatus can also include at least one other LED connected between another pair of connecting means and in series with a resistor for indicating current path integrity and operation of any electrical components.

In accordance with the provisions of the patent statutes, the principle and mode of operation have been explained and illustrated in the preferred embodiment. However, it must be understood that the invention may be practiced otherwise than as specifically illustrated and described without departing from its spirit or scope.

What is claimed is:

1. An apparatus for testing the current path integrity and operation of a speed control circuit having wiring harness and associated electrical components, the circuit including a first circuit connector connected to the ground potential of a power supply, a road speed coil connected between a second circuit connector and a third circuit connector, a normally closed set switch connected between a fourth circuit connector and a fifth circuit connector, and a normally open engagement switch connected between the positive potential of the power supply and the fourth circuit connector, the testing apparatus comprising:

a first and a second apparatus connector connected together and to the first and second circuit connectors respectively;

a first visual indicator and a first current limiting means connected in series between a third and a fourth apparatus connector, said third and fourth apparatus connectors being connected to the third and fourth circuit connectors respectively;

a second visual indicator and a second current limiting means connected in series between said first apparatus connector and a fifth apparatus connector, said first and fifth apparatus connectors being connected to the first and fifth circuit connectors respectively, whereby when the engagement switch is closed, said first and second visual indicators indicate the current path integrity of the portions of the speed control circuit including the road speed coil and the set switch respectively;

wherein the speed control circuit includes a normally open ignition switch connected between the positive potential of the power supply and a sixth circuit connector, a feedback potentiometer connected between the second circuit connector and a seventh circuit connector and a brake light circuit element connected between the ground potential of the power supply and an eighth circuit connector and wherein the testing apparatus further comprises:

a third visual indicator and a third current limiting means connected in series between a sixth and a seventh apparatus connector, the sixth and seventh apparatus connectors being connected to the sixth and seventh circuit connectors respectively; and a fourth visual indicator and a fourth current limiting means connected in series between said sixth apparatus connector and an eighth apparatus connector respectively, said eighth apparatus connector being connected to the eighth circuit connector, whereby when said ignition switch is closed, said third and fourth visual indicators indicate the current path integrity of the portions of the speed control circuit including the feedback potentiometer and the brake light circuit element respectively;

wherein the engagement switch includes a momentary contact resume position connected to a ninth circuit connector, the speed control circuit includes a charge coil connected between a tenth and an eleventh circuit connector and a vent coil connected between the eleventh and a twelfth circuit connector and wherein the testing apparatus further comprises:

a fifth visual indicator and a fifth current limiting means connected in series between a ninth and a tenth apparatus connector, the ninth and tenth apparatus connectors connected to the ninth and tenth circuit connectors respectively;

a line connected between said first apparatus connector and an eleventh apparatus connector, the eleventh apparatus connector being connected to the eleventh circuit connector; and a sixth visual indicator and a sixth current limiting means connected between said ninth apparatus connector and a twelfth apparatus connector, said twelfth apparatus connector being connected to the twelfth circuit connector, whereby when the engagement switch is momentarily in the resume position said fifth and sixth visual indicators indicate the current path integrity of the portions of the speed control circuit including the charge coil and the vent coil respectively; and whereby the correct operation of the speed control circuit is indicated when:

a. said ignition switch is open, said engagement and set switches are closed and all of said visual indicators are off;

b. said ignition, engagement and set switches are closed, said first, second, third and fourth visual indicators are on and said fifth and sixth visual indicators are off;

c. said ignition and engagement switches are closed, said set switch is open, said first, third and fourth visual indicators are on and said second, fifth and sixth visual indicators are off;

d. said ignition and engagement switches are closed, said set switch is open, said brake light circuit element is actuated, said first, second and third visual indicators are on and said fourth, fifth and sixth visual indicators are off; and e. said engagement switch is in the resume position, said ignition and set switches are closed and said first through sixth visual indicators are on.

2. An apparatus according to claim 1 including first voltage limiting means connected in parallel with said fifth visual indicator and said fifth current limiting means and a second voltage limiting means connected in parallel with said sixth visual indicator and said sixth current limiting means.

3. An apparatus according to claim 1 including a means for blocking reverse polarity power connected in series with said fifth and sixth visual indicators.

* * * * *